United States Patent
Kondoh et al.

(10) Patent No.: US 11,665,829 B2
(45) Date of Patent: May 30, 2023

(54) METHOD FOR MANUFACTURING WIRING BOARD

(71) Applicant: TOYOTA JIDOSHA KABUSHIKI KAISHA, Toyota (JP)

(72) Inventors: Haruki Kondoh, Okazaki (JP); Rentaro Mori, Kasugai (JP); Keiji Kuroda, Toyota (JP); Hiroshi Yanagimoto, Miyoshi (JP); Kazuaki Okamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/122,021

(22) Filed: Dec. 15, 2020

(65) Prior Publication Data

US 2021/0204409 A1    Jul. 1, 2021

(30) Foreign Application Priority Data

Dec. 26, 2019    (JP) .............................. JP2019-235494

(51) Int. Cl.
*H05K 3/02*    (2006.01)
*H05K 3/10*    (2006.01)
(Continued)

(52) U.S. Cl.
CPC .............. *H05K 3/027* (2013.01); *H05K 3/12* (2013.01); *H05K 3/16* (2013.01); *C23C 18/28* (2013.01);
(Continued)

(58) Field of Classification Search
CPC .......... H05K 3/16; H05K 3/12; H05K 3/1208; H05K 3/108; H05K 2203/0713;
(Continued)

(56) References Cited

U.S. PATENT DOCUMENTS

| 2007/0101571 A1 | 5/2007 | Kataoka et al. |
| 2007/0111516 A1 | 5/2007 | Abbott |
| 2009/0044971 A1 | 2/2009 | Kataoka et al. |
| 2012/0247814 A1* | 10/2012 | Shimizu ................. H05K 3/108 |
| | | 174/257 |
| 2016/0076162 A1 | 3/2016 | Sato et al. |

(Continued)

FOREIGN PATENT DOCUMENTS

| CN | 106061124 A | 10/2016 |
| JP | 2008-503879 A | 2/2008 |

(Continued)

OTHER PUBLICATIONS

T. Matsuda et al., "Electroplating performance enhancement by controlling resistivity of electrolyte with porous materials for advanced Cu metallization," Proceedings of the IEEE 2001 International Interconnect Technology Conference (Cat. No.01EX461), 2001, pp. 283-285, doi: 10.1109/IITC.2001.930085. (Year: 2001).*

*Primary Examiner* — A. Dexter Tugbang
(74) *Attorney, Agent, or Firm* — Oliff PLC

(57) ABSTRACT

A method for manufacturing a wiring board is capable of forming a metal layer included in a wiring layer to have an even thickness. The method includes preparing a conductive first underlayer on a surface of a substrate; a conductive second underlayer on a surface of the first underlayer; and a seed layer on a surface of the second underlayer and containing metal. The method disposes a solid electrolyte membrane between an anode and the seed layer as a cathode; applies voltage between the anode and the first underlayer to form a metal layer on the surface of the seed layer; removes an exposed portion of the second underlayer without the seed layer from the substrate; and removes an exposed portion of the first underlayer without the seed layer from the (Continued)

substrate. The first underlayer is a material having a higher electrical conductivity than that of the second underlayer.

4 Claims, 8 Drawing Sheets

(51) Int. Cl.
*H05K 3/16* (2006.01)
*H05K 3/12* (2006.01)
*C25D 17/10* (2006.01)
*C23C 18/28* (2006.01)

(52) U.S. Cl.
CPC .............. *C25D 17/10* (2013.01); *H05K 3/108* (2013.01); *H05K 3/1208* (2013.01); *H05K 2203/0713* (2013.01); *H05K 2203/0716* (2013.01); *H05K 2203/0723* (2013.01)

(58) Field of Classification Search
CPC .............. H05K 2203/0716; H05K 2203/0723; H05K 3/027; C23C 18/28; C25D 17/10
See application file for complete search history.

(56) References Cited

U.S. PATENT DOCUMENTS

| 2016/0186354 | A1 | 6/2016 | Hiraoka et al. |
| 2016/0289840 | A1 | 10/2016 | Sato et al. |
| 2017/0009350 | A1* | 1/2017 | Myllymaki ............. C23C 18/38 |
| 2017/0043554 | A1 | 2/2017 | Fujino et al. |
| 2017/0354030 | A1 | 12/2017 | Ho et al. |
| 2019/0029122 | A1* | 1/2019 | Len ........................ H05K 3/108 |

FOREIGN PATENT DOCUMENTS

| JP | 2014098183 A * | 5/2014 |
| JP | 2014-185371 A | 10/2014 |
| JP | 2016-125087 A | 7/2016 |
| KR | 10-2008-0069250 A | 7/2008 |
| TW | 200520110 A | 6/2005 |
| TW | 201542385 A | 11/2015 |
| WO | 2006/009850 A2 | 1/2006 |

* cited by examiner

METHOD FOR MANUFACTURING WIRING BOARD

CROSS REFERENCE TO RELATED APPLICATIONS

The present application claims priority from Japanese patent application JP 2019-235494 filed on Dec. 26, 2019, the entire content of which is hereby incorporated by reference into this application.

BACKGROUND

Technical Field

The present disclosure relates to methods for manufacturing a wiring board to form a wiring layer on the surface of a substrate, and wiring boards.

Background Art

In the conventional methods for manufacturing a wiring board, a metal layer serving as a wiring pattern is formed on the surface of a substrate. Such methods of manufacturing a wiring pattern use a method of film deposition of metallic coating as disclosed in JP 2016-125087 A, for example. The method of film deposition firstly forms a seed layer corresponding to a wiring pattern on the surface of a substrate. Next, the method brings the seed layer into contact with a solid electrolyte membrane impregnated with metal ions, and then applies a power source voltage between an anode and a cathode as the seed layer, thereby to deposit the metal impregnated into the solid electrolyte membrane on the seed layer. Accordingly, the method can obtain a wiring pattern of a metal layer deposited on the seed layer.

SUMMARY

In the film deposition method disclosed in JP 2016-125087 A, a power source is coupled to a portion of the seed layer so that the seed layer functions as a cathode. However, as the wiring pattern becomes minute, it becomes difficult to couple the power source to all of the wiring portions forming the seed layer.

Then, there may be prepared a substrate with seed-layer, which includes: a conductive underlayer on the surface of an insulating substrate; and a seed layer on the surface of the underlayer and containing metal. In this case, it is assumed that the material with low electrical conductivity is selected for the material of the underlayer so that the metal may not be deposited on the surface of the underlayer.

However, when the material with low electrical conductivity is selected for the material of the underlayer, the underlayer may have a high electrical resistance. In this case, the greater the distance from the connecting point with the power source that applies a voltage, less current may flow through the underlayer. When the current distribution of the underlayer is not uniform, the thickness of the metal layer to be formed may be uneven.

In addition, in the manufactured wiring board, the higher the electrical resistance of the underlayer included in the wiring layer, the power transmission efficiency may decrease in accordance with the surface roughness of the insulating substrate when the wiring layer is supplied with a high-frequency current. Specifically, as the surface roughness of the insulating substrate increases, the underlayer tends to have noise when energized. As a result, the power transmission efficiency may decrease.

The present disclosure has been made in view of the foregoing, and the present disclosure provides a method for manufacturing a wiring board capable of forming a metal layer included in a wiring layer to have an even thickness, and such a wiring board capable of suppressing decrease in the power transmission efficiency of insulation.

In view of the foregoing, a method for manufacturing a wiring board according to the present disclosure manufactures a wiring board including an insulating substrate, and a wiring layer disposed on the surface of the insulating substrate and having a predetermined wiring pattern, and the method includes: preparing a substrate with seed-layer, the substrate with seed-layer including: a conductive first underlayer on the surface of the insulating substrate; a conductive second underlayer on the surface of the first underlayer; and a seed layer on the surface of the second underlayer, the seed layer having a predetermined pattern corresponding to the wiring pattern and containing metal; disposing a solid electrolyte membrane between an anode and the seed layer as a cathode, pressing the solid electrolyte membrane against at least the seed layer, and applying voltage between the anode and the first underlayer to reduce metal ions contained in the solid electrolyte membrane and so form a metal layer on the surface of the seed layer; and removing an exposed portion of the second underlayer without the seed layer from the insulating substrate, and after removal of the second underlayer, removing an exposed portion of the first underlayer without the seed layer from the insulating substrate to form the wiring layer. The first underlayer is formed of material having a higher electrical conductivity than that of the second underlayer.

According to the method for manufacturing the wiring board of the present disclosure, the substrate with seed-layer includes an underlayer composed of two layers. Specifically, the underlayer includes a first underlayer disposed on the surface of the substrate and a second underlayer disposed on the surface of the first underlayer. The first underlayer adjacent to the substrate is formed of material having a higher electrical conductivity than that of the second underlayer. With this configuration, when voltage is applied between the anode and the first underlayer while the solid electrolyte membrane is pressed against at least the seed layer, current can flow more uniformly through the first underlayer as described above. Accordingly, current is supplied to the second underlayer from the first underlayer and tends to flow uniformly through the second underlayer.

As a result, as compared to the configuration in which the underlayer does not include the first underlayer but includes only the second underlayer, the method for manufacturing the wiring board of the present disclosure can form a metal layer to have an even thickness. The method removes an exposed portion of the second underlayer, on which the seed layer is not formed, from the substrate having the metal layer formed thereon, and after removal of the second underlayer, removes from the substrate an exposed portion of the first underlayer, on which the seed layer is not formed. The removing step can form a wiring layer having a predetermined wiring pattern on the surface of the substrate.

In some embodiments of the method for manufacturing the wiring board according to the present disclosure, the first underlayer has a volume resistivity within the range from $1.60 B10^{-8}$ W×m to $5.00 B10^{-7}$ W×m. With such a volume resistivity, when voltage is applied between the anode and the first underlayer, current can flow more uniformly through the first underlayer without supplying current to the second underlayer, and therefore a metal layer can be formed to have an even thickness as described above.

Herein, metal material of the first underlayer having a volume resistivity of less than $1.60B10^{-8}$ W×m is not versatile. When the first underlayer has a volume resistivity of more than $5.00B10^{-7}$ W×m, less current flows through the first underlayer, and thus the thickness of the metal layer may be less even.

In some embodiments of the method for manufacturing the wiring board according to the present disclosure, on the assumption that the first underlayer has a volume resistivity within the aforementioned range, the second underlayer has a volume resistivity within the range from $1.0B10^{-6}$ W×m to $3.7B10^{-6}$ W×m. With such a volume resistivity, when voltage is applied between the anode and the first underlayer, deposition of metal on the second underlayer can be suppressed, and a metal layer can be formed to have an even thickness as described above.

Herein, when the second underlayer has a volume resistivity of less than $1.0B10^{-6}$ W×m, the second underlayer does not have sufficient resistance. Thus, the surface of the second underlayer, on which the seed layer is not formed, may have metal deposited thereon. Meanwhile, when the second underlayer has a volume resistivity of more than $3.7B10^{-6}$ W×m, less current may flow through the seed layer as well, which is formed on the surface of the second underlayer. Thus, the deposition efficiency of the metal forming the metal layer may decrease.

In some embodiments of the method for manufacturing the wiring board according to the present disclosure, the second underlayer contains oxide in at least a surface of a portion of the second underlayer, on which the seed layer is not formed, and the first underlayer is formed of material having a higher electrical conductivity than that of a portion of the second underlayer not containing the oxide.

This increases the insulation of the second underlayer on the surface of the exposed portion. Accordingly, when voltage is applied while the solid electrolyte membrane is pressed against the seed layer, current tends to flow at the surface of the seed layer. As a result, deposition of the metal on the surface of the second underlayer can be suppressed, and the metal layer tends to be selectively formed on the surface of the seed layer.

In some embodiments of the method for manufacturing the wiring board according to the present disclosure, the first underlayer has a 10-point average roughness Rz of 0.5 nm or less. Setting the 10-point average roughness Rz within such a range can avoid a break of the seed layer during the formation of the seed layer. Accordingly, a high-density wiring board can be manufactured.

In the specification of the present disclosure, a wiring board having a wiring layer formed on the surface of a substrate is also disclosed. The wiring board according to the present disclosure includes an insulating substrate, and a wiring layer disposed on the surface of the insulating substrate and having a predetermined wiring pattern, the wiring layer including: a conductive first underlayer disposed on the surface of the insulating substrate; a conductive second underlayer disposed on the surface of the first underlayer; a seed layer disposed on the surface of the second underlayer and containing metal; and a metal layer disposed on the surface of the seed layer. The first underlayer is formed of material having a higher electrical conductivity than that of the second underlayer.

Since the first underlayer closer to the surface of the insulating substrate is formed of material having a higher electrical conductivity than that of the second underlayer, when the wiring layer is supplied with a high-frequency current, the wiring board of the present disclosure can suppress decrease in the power transmission efficiency in accordance with the surface roughness of the insulating substrate at the first underlayer. As a result, as compared to the configuration in which the underlayer includes only the second underlayer, it is possible to avoid decrease in the power transmission efficiency of the wiring layer.

In some embodiments of the wiring board according to the present disclosure, the first underlayer has a volume resistivity within the range from $1.60B10^{-8}$ W×m to $5.00B10^{-7}$ W×m. With such a volume resistivity, when the wiring layer is supplied with a high-frequency current, it is possible to suppress decrease in the power transmission efficiency in accordance with the surface roughness of the insulating substrate as described above.

In some embodiments of the wiring board according to the present disclosure, on the assumption that the first underlayer has a volume resistivity within the aforementioned range, the second underlayer has a volume resistivity within the range from $1.0B10^{-6}$ W×m to $3.7B10^{-6}$ W×m. With such a volume resistivity, when the wiring layer is supplied with a high-frequency current, it is possible to more reliably suppress decrease in the power transmission efficiency in accordance with the surface roughness of the insulating substrate as described above.

The method for manufacturing the wiring board of the present disclosure is capable of forming a metal layer included in a wiring layer to have an even thickness. In addition, the wiring board of the present disclosure can suppress decrease in the power transmission efficiency in accordance with the surface roughness of the insulating substrate when the wiring layer is supplied with a high-frequency current.

DETAILED DESCRIPTION

The following describes a wiring board and a method for manufacturing the wiring board according to an embodiment of the present disclosure.

1. Method for Manufacturing Wiring Board 1

Figure 1:
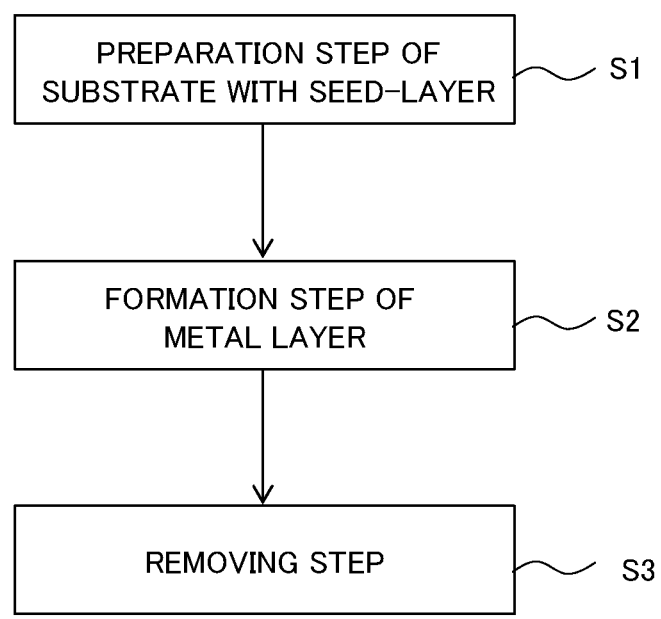
FIG. 1 is a flowchart of a method for manufacturing a wiring board according to an embodiment of the present disclosure.
Figure 2A:
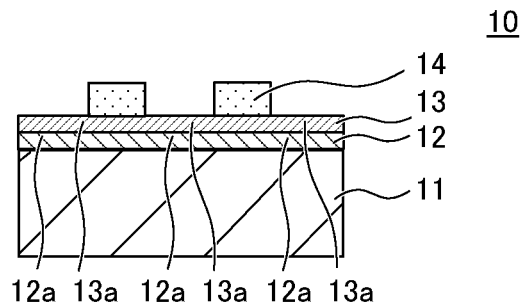
FIG. 2A is a schematic conceptual view for explaining a step of preparing a substrate with seed-layer of FIG. 1.
Figure 2B:
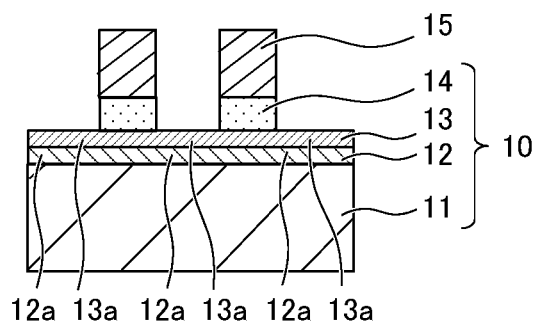
FIG. 2B is a schematic conceptual view for explaining a step of forming a metal layer of FIG. 1.
Figure 2C:
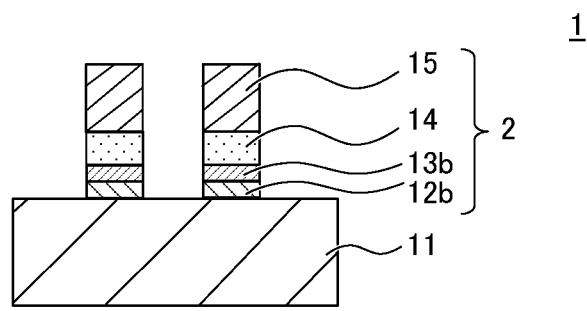
FIG. 2C is a schematic conceptual view for explaining a removing step of FIG. 1.

Firstly the following describes a method for manufacturing a wiring board 1 according to the present embodiment. FIG. 1 is a flowchart of the method for manufacturing the wiring board 1 according to the embodiment of the present disclosure. FIG. 2A to FIG. 2C are schematic conceptual views for explaining a preparation step S1 of a substrate with seed-layer 10, a formation step S2 of a metal layer 15, and a removing step S3 shown in FIG. 1, respectively.

The method for manufacturing the wiring board 1 according to the present embodiment can be applied to the manufacturing of the wiring board 1 including an insulating substrate 11 and a wiring layer 2 disposed on the surface of the insulating substrate 11 and having a predetermined wiring pattern (see FIG. 2C). In particular, the manufacturing method is suitable for the manufacturing of a wiring board having a high-density wiring pattern.

1-1. Preparation Step S1 of Substrate with Seed-Layer 10

The manufacturing method of the present embodiment firstly performs the preparation step S1 of the substrate with seed-layer 10 as shown in FIG. 1. In this step, as shown in FIG. 2A, a first underlayer 12 is disposed on the surface of the substrate 11, a second underlayer 13 is disposed on the surface of the first underlayer 12, and a seed layer 14 is disposed on the surface of the second underlayer 13, to prepare the substrate with seed-layer 10.

In the present embodiment, the prepared substrate with seed-layer 10 includes an underlayer composed of two layers (i.e., the first underlayer 12 and the second underlayer 13). As will be described later, the first underlayer 12 adjacent to the substrate is formed of material having a higher electrical conductivity than that of the second underlayer 13.

1) Substrate 11

The substrate 11 is not particularly limited as long as it has an insulating property, and in some embodiments, a substrate made of a glass epoxy resin, a substrate made of a baked glass epoxy resin, a flexible film-like substrate made of polyimide resin, for example, or a substrate made of glass is used. In the present embodiment, particularly a substrate made of a glass epoxy resin may be used for the substrate 11.

When the substrate 11 is made of resin, examples of the resin include thermoplastic resin, such as ABS resin, AS resin, AAS resin, PS resin, EVA resin, PMMA resin, PBT resin, PET resin, PPS resin, PA resin, POM resin, PC resin, PP resin, PE resin, PI resin (polyimide), polymer alloy resin containing elastomer and PP, modified PPO resin, PTFE resin, ET FE resin, or the like, thermosetting resin, such as phenol resin, melamine resin, amino resin, unsaturated polyester resin, polyurethane, diallylphthalate, silicone resin, alkyd resin, or the like, resin obtained by adding cyanate resin to epoxy resin, for example, and liquid crystal polymer.

2) First Underlayer 12

In the present embodiment, the first underlayer 12 is conductive and supplies current to the seed layer 14, which will be described later. In the present embodiment, as described above, the first underlayer 12 is formed of material having a higher electrical conductivity than that of the second underlayer 13. As used herein, the term "high electrical conductivity" means that the material has a low volume resistivity. With such a low volume resistivity, current can flow more uniformly through the first underlayer 12 during the formation of a metal layer.

The material of the first underlayer 12 is not particularly limited as long as it has a higher electrical conductivity than that of the second underlayer 13, and in some embodiments, examples of the material of the first underlayer 12 include, for example, Al ($2.82B10^{-8}$ W×m), Fe ($1.00B10^{-7}$ W×m), Cr ($1.29B10^{-7}$ W×m), Sn ($1.09B10^{-7}$ W×m), Zn ($6.02B10^{-8}$ W×m), Pb ($2.08B10^{-7}$ W×m), Mn ($4.82B10^{-7}$ W×m), Ni ($6.99B10^{-8}$ W×m), Co ($5.81B10^{-8}$ W×m), Au ($2.44B10^{-8}$ W×m), Ag ($1.59B10^{-8}$ W×m), or Pt ($1.04B10^{-7}$ W×m), or the like. Herein, the volume resistivity of each material is given in the parenthesis.

In the present embodiment, in consideration of the aforementioned material of the first underlayer 12, the first underlayer 12 may have a volume resistivity within the range from $1.60B10^{-8}$ W×m to $5.00B10^{-7}$ W×m. With such a volume resistivity, current can flow more uniformly through the first underlayer 12 during the formation of a metal layer.

Herein, metal material having a volume resistivity of less than $1.60B10^{-8}$ W×m is not versatile. When the first underlayer 12 has a volume resistivity of more than $5.00B10^{-7}$ W×m, less current flows through the first underlayer, and thus the thickness of the metal layer may be less even. The first underlayer 12 has a thickness of 20 nm or more in some embodiments. Note that it is difficult to uniformly form the first underlayer 12 having a thickness of less than 20 nm.

The first underlayer 12 has a 10-point average roughness Rz of 0.5 mm or less in some embodiments. Setting the 10-point average roughness Rz within such a range can avoid a break of the seed layer 14. Meanwhile, when the 10-point average roughness Rz is more than 0.5 mm, a break of the seed layer 14 may occur, leading to a break of the metal layer 15. The term "10-point average roughness Rz" as used in the claims and the specification refers to the roughness defined in JIS B 0601-2013.

Since setting the 10-point average roughness Rz of the first underlayer 12 within the aforementioned range can avoid a break of the seed layer 14 during the formation of the seed layer 14, it is possible to manufacture a high-density wiring board 1.

The first underlayer 12 is formed on the entire surface (i.e., the upper surface in FIG. 2A) of the substrate 11. Various methods for forming the first underlayer 12, such as PVD (physical vapor deposition) using sputtering, CVD (chemical vapor deposition), plating, spin coating, or a print method, may be used.

3) Second Underlayer 13

In the present embodiment, the second underlayer 13 is conductive and supplies current to the seed layer 14. The second underlayer 13 has a volume resistivity within the range from $1.0B10^{-6}$ W×m to $3.7B10^{-6}$ W×m in some embodiments. By combining the second underlayer 13 having a volume resistivity within such a range and the aforementioned first underlayer 12, the thickness of the metal layer 15 to be formed can be made even.

When the second underlayer 13 has a volume resistivity of less than $1.0 \mathrm{B} 10^{-6}$ W×m, the second underlayer does not have sufficient resistance. Thus, the surface of the second underlayer 13 on which the seed layer 14 is not formed may have metal deposited thereon. Meanwhile, when the second underlayer 13 has a volume resistivity of more than $3.7 \mathrm{B} 10^{-6}$ W×m, less current may flow through the seed layer 14 as well formed on the surface of the second underlayer 13. Thus, the deposition efficiency of the metal forming the metal layer 15 may decrease.

In addition, in the present embodiment, the second underlayer 13 may contain oxide in at least the surface of a portion 13a of the second underlayer 13, on which the seed layer 14 is not formed. When the second underlayer 13 contains oxide, the first underlayer 12 is formed of material having a higher electrical conductivity than that of the portion of the second underlayer 13 not containing oxide in some embodiments. It should be noted that the portion of the second underlayer 13 not containing oxide is composed of material (base metal) which mainly forms the second underlayer 13.

The oxide may be a natural oxide film formed naturally due to natural oxidation in the atmosphere or may be an oxide film formed on the surface by surface treatment.

Examples of the natural oxide film may include a $SiO_2$ film formed on the surface of silicide such as $ZrSi_2$ and $WSi_2$, or a passive film formed on the surface of Al, Cr, Ti and its alloys.

Meanwhile, examples of the oxide film formed by surface treatment may include an oxide film having a higher insulating property than that of the second underlayer 13, specifically, an oxide film formed by performing oxidation treatment on the surface of the second underlayer 13 or an oxide film separately disposed on the surface of the second underlayer 13 by evaporation. Examples of the oxidation treatment may include $O_2$ plasma treatment, laser irradiation, or furnace heating. Examples of the evaporation may include plasma CVD, thermal CVD, or PVD using sputtering. When an oxide film is formed by surface treatment, the seed layer 14 is formed, and then the surface treatment is performed on the exposed portion 13a in some embodiments, and as appropriate a metal mask is provided on the seed layer 14 in some embodiments.

Examples of the material of the second underlayer 13 may include specifically metal silicide such as $ZrSi_2$, $WSi_2$, $CrSi_2$, or $MoSi_2$, metal such as Ti, Zr, Cr, Ni, or Si, or one or more metals.

The thickness of the second underlayer 13 is not particularly limited, and is 1 to 200 nm in some embodiments. The thickness of the second underlayer 13 less than 1 nm may cause difficulty in forming the second underlayer 13. On the other hand, the thickness of the second underlayer 13 more than 200 nm may increase the material cost and the process cost.

The second underlayer 13 is formed on the surface (i.e., the upper face in FIG. 2A) of the first underlayer 12. The method for forming the second underlayer 13 is not particularly limited, and various methods, such as PVD using sputtering, CVD, or plating, may be used.

4) Seed Layer 14

The seed layer 14 is a layer including metal. In some embodiments, the material of the seed layer 14 is noble metal having high oxidation resistance, and one or more metals selected from the group consisting of Pt, Pd, Rh, Cu, Ag, and Au is used. The thickness of the seed layer 14 is not particularly limited, and is 20 nm or more to avoid unevenness of the metal layer 15 during the formation of the metal layer 15 in some embodiments, or 300 nm or less in consideration of the manufacturing cost in some embodiments.

The seed layer 14 is a layer serving as a cathode when the metal layer 15 having a wiring pattern is formed. The seed layer 14 is formed of a plurality of independent patterns according to the wiring pattern, and the adjacent independent patterns are disposed apart from each other and are not conductive.

Accordingly, the independent patterns forming the seed layer 14 are conductive to each other through the first and second underlayers 12, 13. This configuration does not require the formation of a lead for application of voltage on the seed layer 14 when the metal layer 15 (which will be described in detail later) is formed. In this way there is no need for a space for forming the lead, and so a higher density wiring pattern can be easily formed.

The seed layer 14 is formed by disposing ink containing metal particles dispersed therein and solidifying the disposed ink on the surface of the second underlayer 13 to have a predetermined pattern. Specifically, various print methods, such as screen printing, inkjet printing, and transfer printing, may be used. The seed layer 14 may also be formed without using ink and by evaporation or sputtering, for example.

1-2. Formation Step S2 of Metal Layer 15

Figure 3:
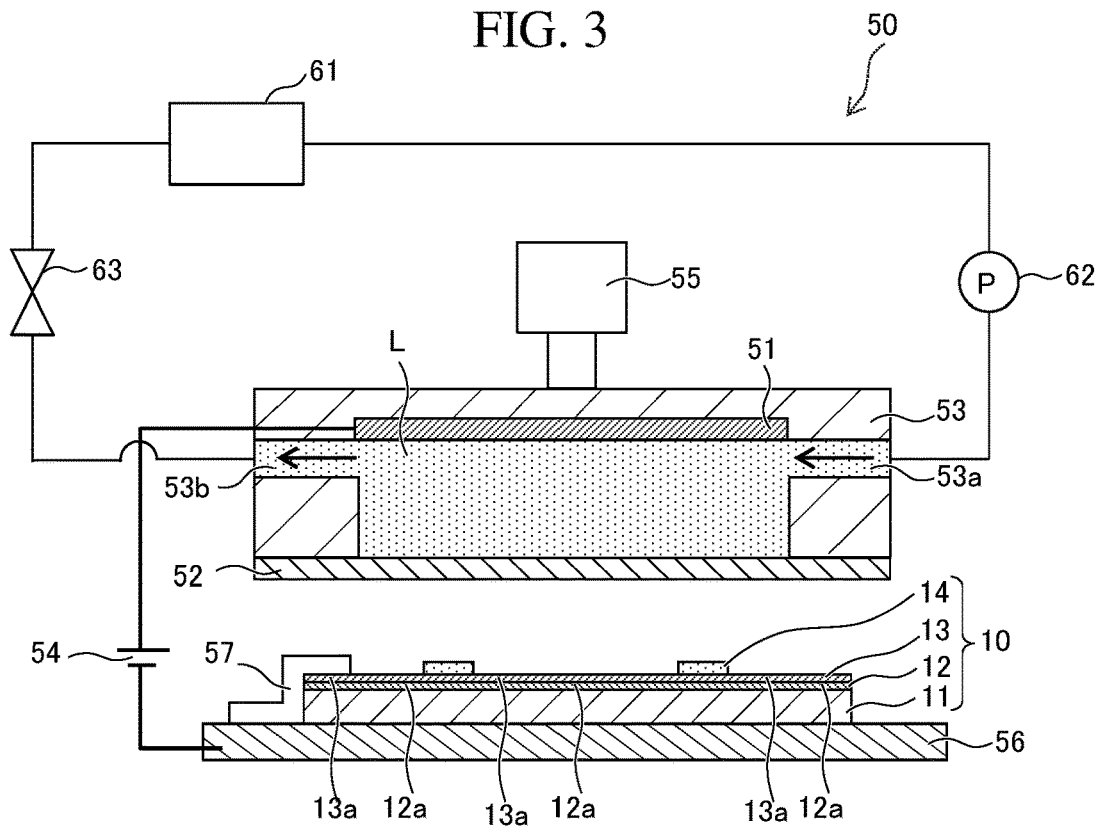
FIG. 3 is a cross-sectional view showing the structure of a film-deposition apparatus that is used to manufacture a wiring board according to the embodiment of the present disclosure.
Figure 4:
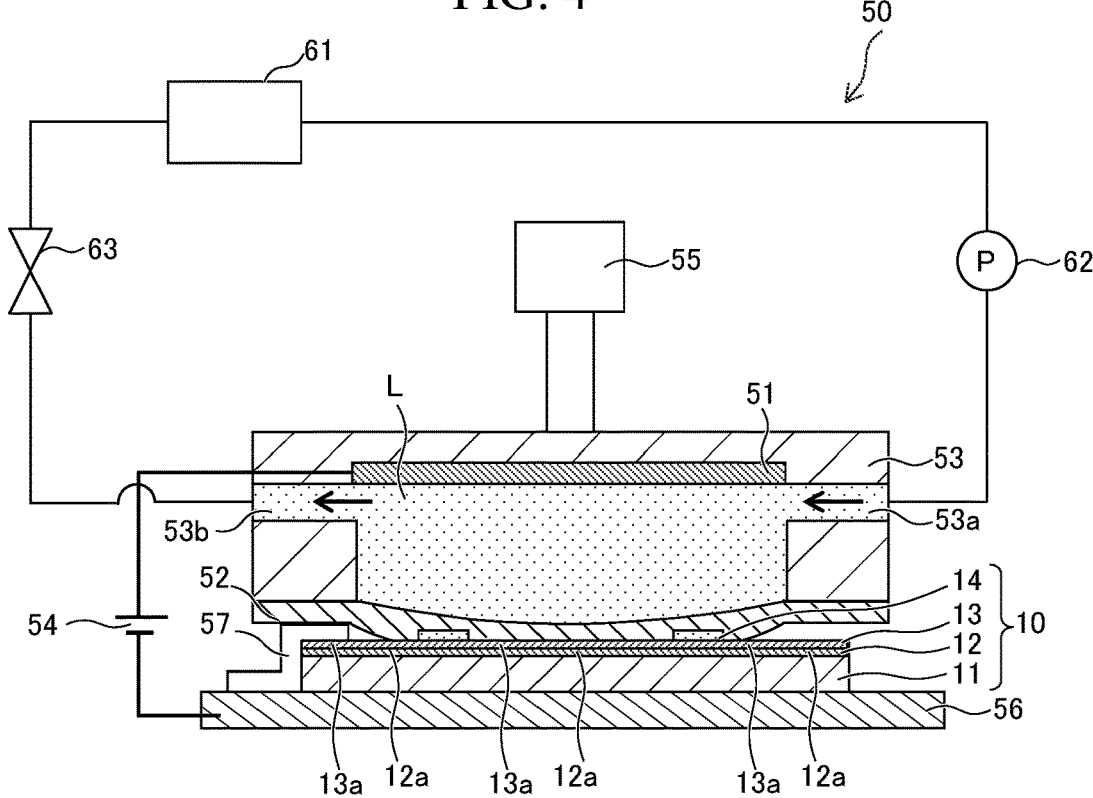
FIG. 4 is a cross-sectional view of the film-deposition apparatus shown in FIG. 3 when the housing is lowered to a predetermined height.

Next, as shown in FIG. 1, the formation step S2 of the metal layer 15 is performed. In this step, a film-deposition apparatus 50 shown in FIG. 3 and FIG. 4 is used to form the metal layer 15 on the surface of the seed layer 14 of the substrate with seed-layer 10 as shown in FIG. 2B. In some embodiments, the material of the metal layer 15 is Cu, Ni, Ag, or Au, particularly Cu. The thickness of the metal layer 15 is, for example, 1 mm or more and 100 mm or less.

With reference to FIG. 3 and FIG. 4, firstly the film-deposition apparatus 50 will be described and then, the formation of the metal layer 15 using the film-deposition apparatus 50 will be described. FIG. 3 is a cross-sectional view showing the structure of the film-deposition apparatus 50 that is used to manufacture the wiring board 1 according to the embodiment of the present disclosure. FIG. 4 is a cross-sectional view of the film-deposition apparatus 50 shown in FIG. 3 when a housing 53 is lowered to a predetermined height.

1) Structure of Film-Deposition Apparatus 50

The film-deposition apparatus 50 is a film-deposition apparatus (i.e., a plating apparatus) for depositing the metal layer 15 as metallic coating by solid electrolyte deposition and is used to deposit (to form) the metal layer 15 on the surface of the seed layer 14.

As shown in FIG. 3, the film-deposition apparatus 50 includes a metal anode 51, a solid electrolyte membrane 52 disposed between the anode 51 and the seed layer 14 that is a cathode, and a power supply 54 to apply voltage between the anode 51 and the first and second underlayers 12, 13. The first and second underlayers 12, 13 and the seed layer 14 are conductive, and therefore electric current flows between the anode 51 and the seed layer 14 during film deposition by applying voltage between the anode 51 and the first and second underlayers 12, 13 from the power supply 54.

In the present embodiment, the film-deposition apparatus 50 further includes a housing 53. The housing 53 stores the anode 51 and solution L (hereinafter referred to as metallic solution L) containing ions of metal (for example, Cu), that is the material of the metal layer 15. More specifically, a space for containing the metallic solution L is defined between the anode 51 and the solid electrolyte membrane 52, and the metallic solution L stored in the space flows from one side to the other side.

As shown in FIG. 3, the anode 51 has a plate shape, and may be either a soluble anode made of the same material (e.g., Cu) as the metal layer 15 or an anode made of material (e.g., Ti) that is insoluble in the metallic solution L when the anode 51 and the solid electrolyte membrane 52 are disposed away from each other. Meanwhile, though not illustrated in the drawings, when the anode 51 and the solid electrolyte membrane 52 are in contact with each other, the anode 51 may include an anode made of a porous body that transmits the metallic solution L and supplies metal ions to the solid electrolyte membrane 52.

When the anode 51 is pressed against the solid electrolyte membrane 52, uneven deposition may occur due to a variation in the pressing force of the anode 51 against the solid electrolyte membrane 52. Accordingly, the configuration in which the anode 51 and the solid electrolyte membrane 52 are disposed away from each other is favorable to manufacture a fine wiring pattern as shown in FIG. 3.

The solid electrolyte membrane 52 is not particularly limited, as long as when the solid electrolyte membrane 52 comes in contact with the metallic solution L as stated above, the solid electrolyte membrane 52 can be impregnated with (contain) metal ions, and when voltage is applied, the metal originating from the metal ions can be deposited on the surface of the cathode (the seed layer 14).

The thickness of the solid electrolyte membrane 52 is about 5 mm to about 200 mm, for example. Examples of the material of the solid electrolyte membrane 52 may include resin having a cation exchange function, including fluorine-based resin, such as Nafion (registered trademark) manufactured by DuPont, hydrocarbon resin, polyamic acid resin, and Selemion (CMV, CMD, CMF series) manufactured by Asahi Glass Co, for example.

The metallic solution L is liquid containing the metal of the metal layer 15 in an ionic state, and examples of the metal include Cu, Ni, Ag, or Au. The metallic solution L is a solution (ionization) of these metals with an acid, such as nitric acid, phosphoric acid, succinic acid, sulfuric acid, or pyrophosphoric acid.

The film-deposition apparatus 50 of the present embodiment further includes an elevator 55 above the housing 53 to move the housing 53 up and down. As long as the elevator 55 can move the housing 53 up and down, the elevator 55 may include a hydraulic or pneumatic cylinder, an electric actuator, a linear guide, and a motor, for example.

The housing 53 has a supply port 53a for supplying the metallic solution L and a discharge port 53b for discharging the metallic solution L. These supply port 53a and discharge port 53b connect to a tank 61 via a pipe. The metallic solution L sent from the tank 61 by the pump 62 flows into the housing 53 through the supply port 53a, is discharged from the discharge port 53b, and returns to the tank 61. The film-deposition apparatus 50 includes a pressure regulation valve 63 downstream of the discharge port 53b, and the pressure regulation valve 63 and the pump 62 pressurize the metallic solution L in the housing 53 with a predetermined pressure.

With this configuration, the solid electrolyte membrane 52 presses the seed layer 14 and the second underlayer 13 due to the liquid pressure of the metallic solution L during film deposition (see FIG. 4). As a result, the metal layer 15 can be formed on the seed layer 14 while uniformly pressing the seed layer 14 and the second underlayer 13 with the solid electrolyte membrane 52.

The film-deposition apparatus 50 of this embodiment includes a metallic mount 56 to mount the substrate with seed-layer 10. The metallic mount 56 electrically connects (is conductive) to the negative electrode of the power supply 54. The positive electrode of the power supply 54 electrically connects (is conductive) to the anode 51 that is built in the housing 53.

Specifically, the film-deposition apparatus 50 includes a conductive member 57 that comes in contact with a part of the first and second underlayers 12, 13 or the seed layer 14 (specifically with their ends) during film deposition of the metal layer 15 so as to establish electric continuity between the negative electrode of the power supply 54 and the first and second underlayers 12, 13 or the seed layer 14. The conductive member 57 is a metal plate that covers a part of the edge of the substrate with seed-layer 10, and a part of the conductive member 57 is bent so as to be in contact with the metallic mount 56. This allows the metallic mount 56 to be conductive to the first and second underlayers 12, 13 via the conductive member 57. The conductive member 57 may be attached to or detached from the substrate with seed-layer 10.

2) Formation of Metal Layer 15 Using Film-Deposition Apparatus 50

The formation step S2 of the metal layer 15 places the substrate with seed-layer 10 and the conductive member 57 at predetermined positions on the metallic mount 56 as shown in FIG. 3. Then, as shown in FIG. 4, the elevator 55 lowers the housing 53 to a predetermined height.

Next, when the metallic solution L is pressurized by the pump 62, the solid electrolyte membrane 52 is deformed to follow the shapes of the seed layer 14 and the second underlayer 13, and the metallic solution L in the housing 53 has a set constant pressure by the pressure regulation valve 63. That is, the solid electrolyte membrane 52 is able to uniformly press the surface of the seed layer 14 and the surface of the portion 13a of the second underlayer 13 without the seed layer 14 with the adjusted liquid pressure of the metallic solution L in the housing 53.

While the solid electrolyte membrane 52 presses the surface of the seed layer 14 and the surface of the exposed portion 13a of the second underlayer 13, voltage is applied between the anode 51 and the first and second underlayers 12, 13 to reduce metal ions contained in the solid electrolyte membrane 52. As a result, metal originating from the metal ions is deposited on the surface of the seed layer 14. Since the voltage applied reduces metal ions in the metallic solution L in the housing 53 continuously at the cathode, the metal layer 15 is formed on the surface of the seed layer 14 as shown in FIG. 2B.

Herein, the underlayer of the present embodiment includes the first and second underlayers 12, 13, and since the first underlayer 12 has a higher electrical conductivity than that of the second underlayer 13, current can more uniformly flow through the first underlayer 12 adjacent to the substrate 11 during the formation of the metal layer 15. If the underlayer includes only a second underlayer, the amount of current flowing through the underlayer decreases as the distance from the power supply position increases due to the volume resistivity of the second underlayer. In the present embodiment, however, with the first underlayer 12 having a higher electrical conductivity than that of the second underlayer 13, the current can stably flow through the first underlayer 12. Since the current can uniformly flow through the second underlayer 13, the metal layer 15 can be formed to have an even thickness.

When the second underlayer 13 contains oxide, such as a natural oxide film or an oxide film formed by surface treatment, in the surface of the exposed portion 13a of the second underlayer 13 without the seed layer 14, the surface of the exposed portion 13a may have a higher insulating property. While the solid electrolyte membrane 52 is in close contact with the surface of the seed layer 14 and the surface of the exposed portion 13a of the second underlayer 13, the current flows only at the surface of the seed layer 14. Metal ions (e.g., Cu ions) contained in the solid electrolyte membrane 52 therefore are reduced on the surface of the seed layer 14, and the metal (e.g., Cu) is deposited there. As a result, the metal layer 15 is selectively formed on the surface of the seed layer 14 (see FIG. 2B), and it is possible to prevent the deposition of the metal on the surface of the exposed portion 13a of the second underlayer 13.

When the metal layer 15 is formed to have a predetermined thickness, application of voltage between the anode 51 and the first and second underlayers 12, 13 stops, and pressurization of the metallic solution L by the pump 62 stops. Then, the housing 53 is raised to a predetermined height (see FIG. 3), and the substrate with seed-layer 10 (see FIG. 2B) having the metal layer 15 is removed from the metallic mount 56.

1-3. Removing Step S3

Next, a removing step S3 is performed as shown in FIG. 1. This step removes the exposed portion 13a of the second underlayer 13 without the seed layer 14 from the substrate 11, and then, after the removal of the second underlayer 13, removes an exposed portion 12a of the first underlayer 12 without the seed layer 14 from the substrate 11. The removing step can form a wiring layer 2 on the surface of the substrate 11 as shown in FIG. 2C.

The method for removing the first and second underlayers 12, 13 is not particularly limited, and various methods, such as plasma etching, sputtering, and chemical etching, may be used. When the underlayer 12 is made of $WSi_2$ or $ZrSi_2$, for example, the exposed portions 12a, 13a without the seed layer 14 are removed by plasma etching using $CF_4$ gas in some embodiments. The removing step forms the wiring layer 2 including the first and second underlayers 12b, 13b, the seed layer 14, and the metal layer 15 on the surface of the substrate 11 as shown in FIG. 2C.

2. Wiring Board 1

The wiring board 1 shown in FIG. 2C can be manufactured in the above-described manner. The manufactured wiring board 1 includes the insulating substrate 11 and the wiring layer 2 disposed on the substrate 11 and having a predetermined wiring pattern. The wiring layer 2 includes the first underlayer 12b disposed on the surface of the substrate 11, the second underlayer 13b disposed on the surface of the first underlayer 12b, the seed layer 14 containing metal disposed on the surface of the second underlayer 13b, and the metal layer 15 disposed on the surface of the seed layer 14. The first and second underlayers 12b, 13b are conductive, and the first underlayer 12b is formed of material having a higher electrical conductivity than that of the second underlayer 13b.

In the wiring board 1 of the present embodiment, the underlayer includes two layers, that is, the first and second underlayers 12b, 13b. Further, the first underlayer 12b adjacent to the substrate is formed to have a higher electrical conductivity than that of the second underlayer 13b (to have lower electrical resistance). With this configuration, when the wiring layer 2 is supplied with a high-frequency current, the wiring board 1 can suppress decrease in the power transmission efficiency in accordance with the surface roughness of the insulating substrate 11 at the first underlayer 12b. As a result, as compared to the configuration in which the underlayer includes only the second underlayer 13b, it is possible to avoid decrease in the power transmission efficiency of the wiring layer 2.

In the wiring board 1 of the present embodiment, the first underlayer 12b has a volume resistivity within the range from $1.60B10^{-8}$ W×m to $5.00B10^{-7}$ W×m in some embodiments. In addition, in the wiring board 1 of the present embodiment, the second underlayer 13b has a volume resistivity within the range from $1.0B10^{-6}$ W×m to $3.71B10^{-6}$ W×m in some embodiments. Setting volume resistivities in such ranges can increase the aforementioned power transmission efficiency of the wiring board 1.

EXAMPLES

The following describes Examples of the present disclosure.

(Evaluation of Metal Layer Thickness)

Figure 5:
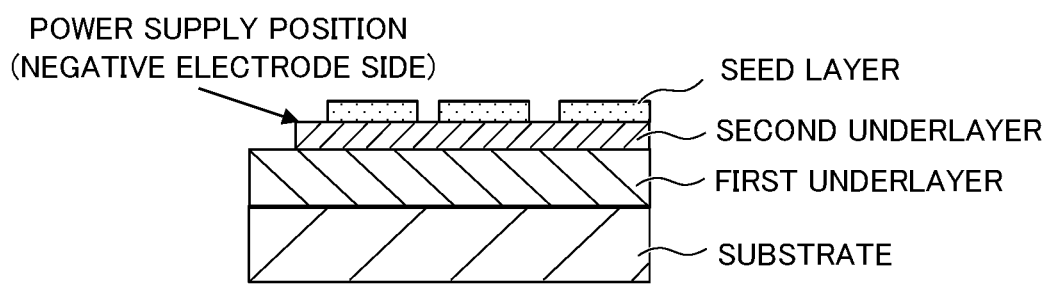
FIG. 5 is a cross-sectional view showing the structure of a test substrate according to Reference Example 1-1 to Reference Example 1-3.
Figure 6:
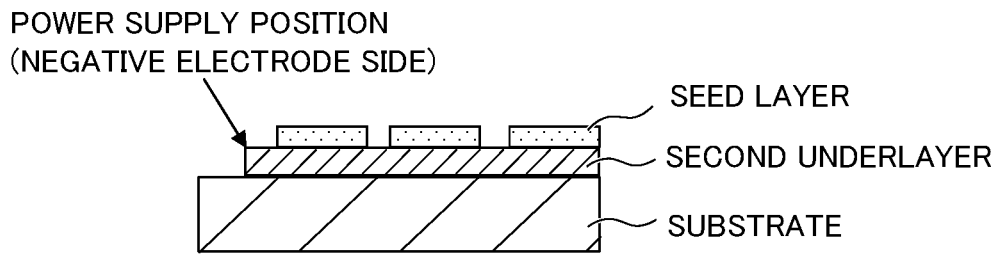
FIG. 6 is a cross-sectional view showing the structure of a test substrate according to Reference Comparative Example 1-1 to Reference Comparative Example 1-3.

Test substrates according to Reference Example 1-1 to Reference Example 1-3 and Reference Comparative Example 1-1 to Reference Comparative Example 1-3 were prepared, and the thickness of the metal layer was evaluated. FIG. 5 is a cross-sectional view showing the structure of a test substrate according to Reference Example 1-1 to Reference Example 1-3. FIG. 6 is a cross-sectional view showing the structure of a test substrate according to Reference Comparative Example 1-1 to Reference Comparative Example 1-3.

Reference Example 1-1

Firstly, a test substrate (see FIG. 5) corresponding to the substrate with seed-layer 10 of the present embodiment was prepared according to the aforementioned manufacturing method. Specifically, an Al layer serving as a first underlayer was formed to have a thickness of 1 mm by sputtering on a glass board prepared as a substrate. It should be noted that the Al layer has a volume resistivity of about $2.82B10^{-8}$ W×m. Next, a $WSi_2$ layer serving as a second underlayer was formed to have a thickness of 100 nm and a sheet resistance of 10 W/sq. (i.e., a volume resistivity of $1.0B10^{-6}$ W×m) by sputtering on the formed first underlayer. It should be noted that the sheet resistance was measured with a resistivity meter (Loresta-GX available from MITSUBISHI CHEMICAL ANALYTECH CO., LTD.). Next, a Cu layer serving as a seed layer was formed to have a predetermined pattern and a thickness of 100 nm by screen printing on the formed second underlayer. A test substrate with seed layer was prepared in this way.

Next, a metal layer was formed on the surface (area of 9 $cm^2$) of the seed layer of the test substrate by the film-deposition apparatus 50 shown in FIG. 3 and FIG. 4 to prepare a test body of Reference Example 1-1. Herein, the conditions of the film-deposition apparatus include as follows: 1.0 mol/L copper sulfate aqueous solution was used as the metallic solution, oxygen-free copper wire was used as an anode, and Nafion (registered trademark) (thickness of about 8 nm) was used as a solid electrolyte membrane. While the solid electrolyte membrane was pressed against the seed layer with 1.0 M Pa by a pump, the metal layer was formed under the deposition conditions of a current density of 23 $mA/cm^2$ and a deposition time of 20 minutes.

[Measurement of Metal Layer Thickness]

In the test body of Reference Example 1-1, the thickness of the metal layer formed on the seed layer was measured by a stylus profilemeter (Dektak150 available from ULVAC, Inc.) at a plurality of positions away from the power supply position (negative electrode) by a predetermined distance as shown in FIG. 5.

Reference Example 1-2

A second underlayer was formed to have a sheet resistance of 20 W/sq. (i.e., a volume resistivity of $2.01B10^{-6}$ W×m). Otherwise, the preparation method was the same as Reference Example 1-1. A test body of Reference Example 1-2 was prepared and the thickness of the metal layer was measured. It should be noted that when the second underlayer was formed, sputtering conditions were adjusted and the sheet resistance was changed to a predetermined level while maintaining the thickness of the second underlayer to 100 nm.

Reference Example 1-3

A second underlayer was formed to have a sheet resistance of 37W/sq. (i.e., a volume resistivity of $3.7B10^{-6}$ W×m). Otherwise, the preparation method was the same as Reference Example 1-1. A test body of Reference Example 1-3 was prepared and the thickness of the metal layer was measured. It should be noted that when the second underlayer was formed, sputtering conditions were adjusted and the sheet resistance was changed to a predetermined level while maintaining the thickness of the second underlayer to 100 nm.

Reference Comparative Example 1-1 to Reference Comparative Example 1-3

Figure 7:
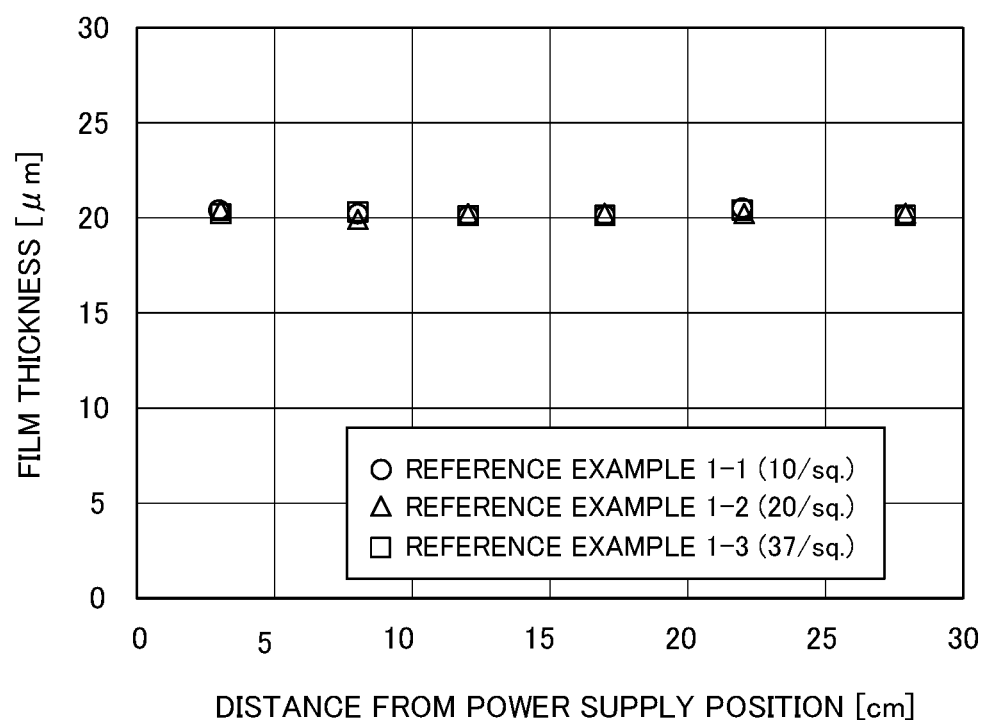
FIG. 7 is a graph showing the relation between the distance from a power supply position and the thickness (film thickness) of a metal layer in Reference Example 1-1 to Reference Example 1-3.
Figure 8:
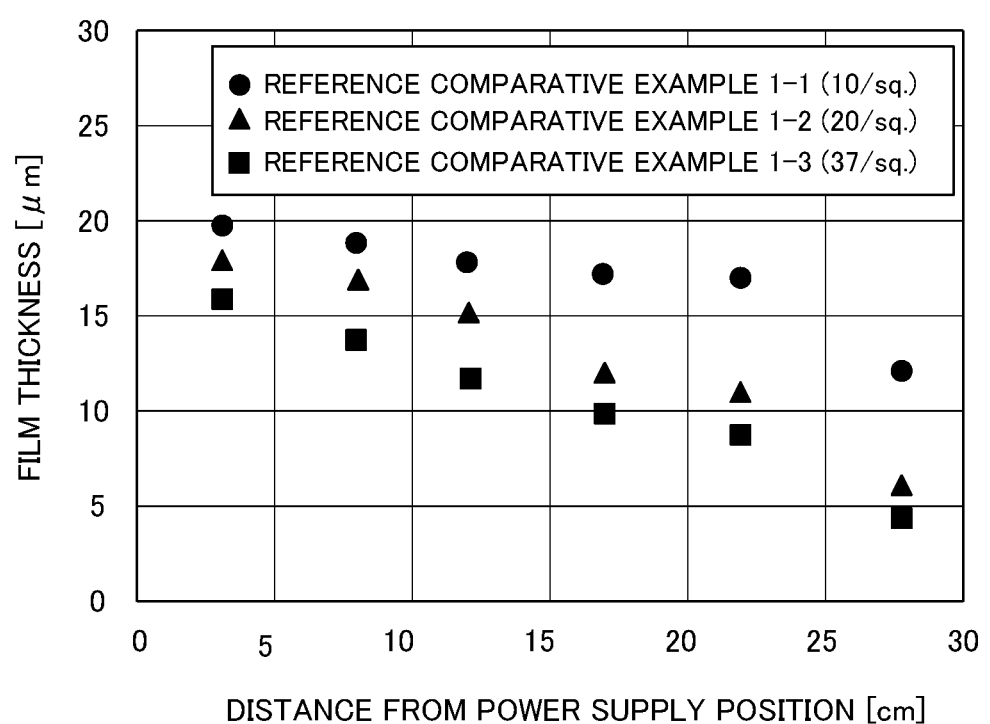
FIG. 8 is a graph showing the relation between the distance from a power supply position and the thickness (film thickness) of a metal layer in Reference Comparative Example 1-1 to Reference Comparative Example 1-3.

As shown in FIG. 6, test substrates of Reference Comparative Example 1-1 to Reference Comparative Example 1-3 did not include a first underlayer. This was different from the test substrates of Reference Example 1-1 to Reference Example 1-3. Specifically, an Al layer was not formed as a first underlayer. Otherwise, the preparation method was the same as Reference Example 1-1 to Reference Example 1-3. Test bodies of Reference Comparative Example 1-1 to Reference Comparative Example 1-3 were separately prepared. Then, in each of the test bodies, a power supply position was set as shown in FIG. 6. Otherwise, the preparation method was the same as Reference Example 1-1 and the thickness of the metal layer was measured.
[Results and Considerations]
The results of Reference Example 1-1 to Reference Example 1-3 and Reference Comparative Example 1-1 to Reference Comparative Example 1-3 are respectively shown in FIG. 7 and FIG. 8. FIG. 7 is a graph showing the relation between the distance from the power supply position and the thickness (film thickness) of the metal layer in Reference Example 1-1 to Reference Example 1-3. In the graph, an open circle (VIII), an open triangle (늡), and an open square (ᄾ) respectively denote Reference Example 1-1, Reference Example 1-2, and Reference Example 1-3. FIG. 8 is a graph showing the relation between the distance from the power supply position and the thickness (film thickness) of the metal layer in Reference Comparative Example 1-1 to Reference Comparative Example 1-3. In the graph, a filled circle (✔), a filled triangle (IV), and a filled square (II) respectively denote Reference Comparative Example 1-1, Reference Comparative Example 1-2, and Reference Comparative Example 1-3.

As can be understood from FIG. 8, the thickness of the metal layer decreased as the distance from the power supply position increased in Reference Comparative Example 1-1 to Reference Comparative Example 1-3. In these Reference Comparative Examples, the underlayer included only a second underlayer. Therefore, it is assumed that due to the volume resistivity of the second underlayer, the current supplied to the second underlayer decreases as the distance from the power supply position increases, and the thickness of the metal layer decreases. It is assumed that such decrease in the thickness is greater because the distance from the power supply position increases as the size of the substrate increases.

Meanwhile, as can be understood from FIG. 7, the thickness of the metal layer did not change even if the distance from the power supply position increased in Reference Example 1-1 to Reference Example 1-3. In these Reference Examples, the underlayer included the first underlayer disposed adjacent to the substrate as well as the second underlayer disposed adjacent to the seed layer. In addition, the volume resistivity of the first underlayer adjacent to the substrate was less than the volume resistivity of the second underlayer. That is, the first underlayer adjacent to the substrate was formed of material having a higher electrical conductivity than that of the second underlayer.

With this configuration, during the formation of the metal layer, the current can flow more uniformly through the first underlayer, and therefore the second underlayer can be supplied with the current from the first underlayer even when there is a large distance from the power supply position, and thus can maintain a uniform current distribution. Therefore, it is assumed that the metal layer can be formed to have an even thickness.
(Confirmation of Presence/Absence of Break of Seed Layer)
Next, the presence or absence of a break of the seed layer was confirmed with the test bodies of Reference Example 2-1 to Reference Example 2-3 including the first underlayer and the test bodies of Reference Comparative Example 2-1 to Reference Comparative Example 2-3 not including the first underlayer. The following describes the details.

Reference Example 2-1

A glass board having a 10-point average roughness Rz of 0.5 mm was prepared as a substrate, and an Ag layer having a thickness of 1 nm was formed as a first underlayer by spin coating on the surface of the prepared substrate. Then, a $WSi_2$ layer having a thickness of 100 nm was formed as a second underlayer by sputtering on the surface of the formed first underlayer. Next, an Ag layer having a thickness of 100 nm was formed as a seed layer by sputtering using a mask on the surface of the formed second underlayer. A test body of Reference Example 2-1 was prepared in this way.

Reference Example 2-2, Reference Example 2-3

Using the same preparation method as Reference Example 2-1, test bodies of Reference Example 2-2 and Reference Example 2-3 were prepared. It should be noted that the boards of Reference Example 2-2 and Reference Example 2-3 prepared as the substrates were a glass epoxy board having a 10-point average roughness Rz of 3.0 mm and a baked glass epoxy board having a 10-point average roughness Rz of 5.0 mm, respectively.

Reference Comparative Example 2-1 to Reference Comparative Example 2-3

An Ag layer was not formed as a first underlayer. Otherwise, test bodies of Reference Comparative Example 2-1 to Reference Comparative Example 2-3 were prepared using the same preparation method as Reference Example 2-1 to Reference Example 2-3.

[Test to Confirm Presence/Absence of Break]

The presence or absence of a break of the seed layer formed on the test bodies of Reference Example 2-1 to Reference Example 2-3 and Reference Comparative Example 2-1 to Reference Comparative Example 2-3 was visually observed.

[Results and Considerations]

Figure 9A:
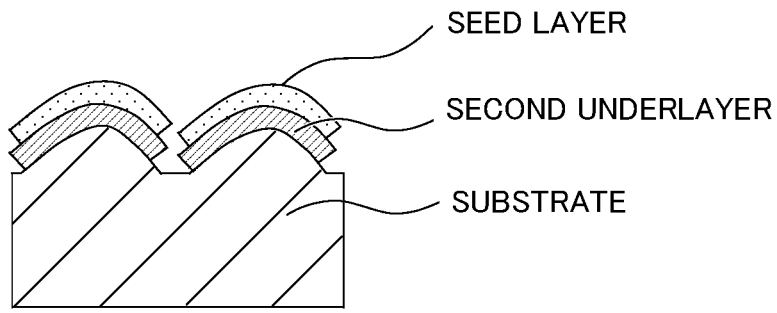
FIG. 9A is an enlarged cross-sectional view of a portion near the surface of the substrate in Reference Comparative Example 2-2 and Reference Comparative Example 2-3.
Figure 9B:
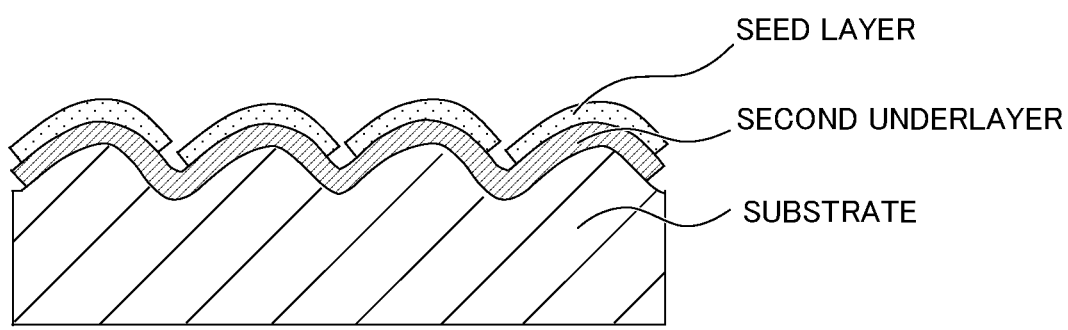
FIG. 9B is another enlarged cross-sectional view of a portion near the surface of the substrate in Reference Comparative Example 2-2 and Reference Comparative Example 2-3.
Figure 9C:
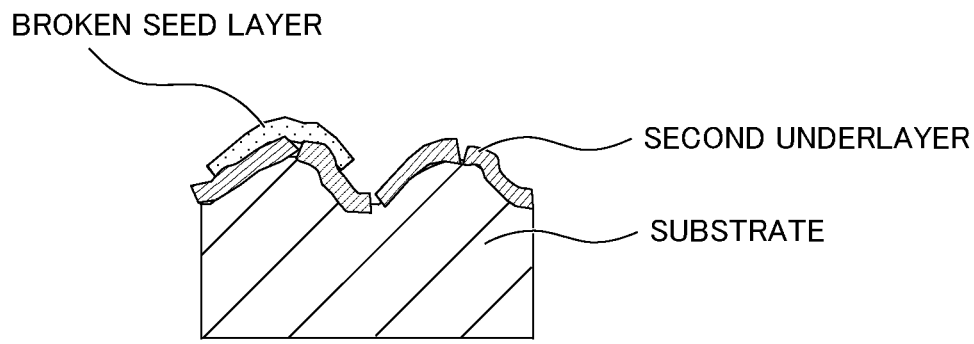
FIG. 9C is a cross-sectional view explaining the state where a seed layer is broken.
Figure 10:
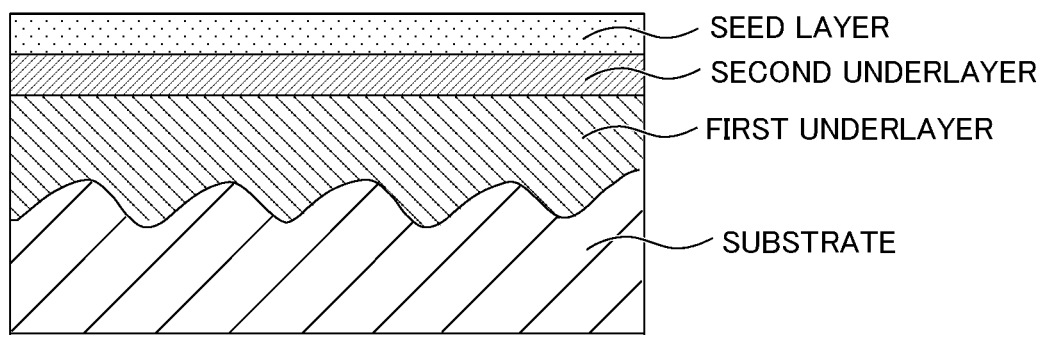
FIG. 10 is an enlarged cross-sectional view of a portion near the surface of the substrate in Reference Example 2-1 to Reference Example 2-3.

Table 1 shows the observation results. In Table 1, "good" mark indicates that a break was not found, and "bad" indicates that a break was found. FIG. 9A and FIG. 9B show an enlarged cross-sectional view and another enlarged cross-sectional view of portions near the surface of the substrate in Reference Comparative Example 2-2 and Reference Comparative Example 2-3, respectively. FIG. 9C is a cross-sectional view explaining the state where the seed layer is broken. FIG. 10 is an enlarged cross-sectional view of a portion near the surface of the substrate in Reference Example 2-1 to Reference Example 2-3.

TABLE 1

| | Surface roughness (Rz) of board (substrate) mm | Presence/absence of break |
|---|---|---|
| Reference Example 2-1 | 0.5 | good |
| Reference Example 2-2 | 3.0 | good |
| Reference Example 2-3 | 5.0 | good |
| Reference Comparative Example 2-1 | 0.5 | good |
| Reference Comparative Example 2-2 | 3.0 | bad |
| Reference Comparative Example 2-3 | 5.0 | bad |

As can be understood from Table 1, among Reference Comparative Example 2-1 to Reference Comparative Example 2-3, a break of the seed layer was not found in Reference Comparative Example 2-1, whereas a break of the seed layer was found in Reference Comparative Example 2-2 and Reference Comparative Example 2-3.

A break of the seed layer was found in Reference Comparative Example 2-2 and Reference Comparative Example 2-3 because the board (substrate) of Reference Comparative Example 2-2 and Reference Comparative Example 2-3 having a 10-point average roughness Rz of more than 0.5 mm presumably made it difficult for the second underlayer and the seed layer to follow the irregularities of the substrate as shown in FIG. 9A depending on the material of the substrate. Even if the second underlayer can follow the irregularities of the substrate as shown in FIG. 9B, the second underlayer may not suppress the 10-point average roughness Rz of the substrate to an extent that the seed layer may follow the irregularities of the second underlayer. There may also be a case where the seed layer may not follow the irregularities.

As described above, it is assumed that a 10-point average roughness Rz of more than 0.5 mm may not allow the seed layer to follow the irregularities of the substrate. This may cause a break (peeling) of the seed layer as shown in FIG. 9C. As a result, it is difficult to form a metal layer.

Meanwhile, as can be understood from Table 1, a break of the seed layer was not found in Reference Example 2-1 to Reference Example 2-3. It is assumed that a break of the seed layer was not found because providing the first underlayer having a thickness of 0.5 mm or more on the substrate as shown in FIG. 10 suppressed the surface roughness of the substrate. It can be said that this allowed the second underlayer and the seed layer to follow the irregularities of the substrate.

In addition, in consideration of the above-described results of Reference Comparative Example 2-1 to Reference Comparative Example 2-3, the substrate having a 10-point average roughness Rz of 0.5 mm or less may avoid a break of the seed layer. As a result, it is possible to form a metal layer having a desired wiring pattern, and thus manufacture a high-density wiring board.

Although the embodiment of the present disclosure has been described in detail above, the present disclosure is not limited to the above embodiment, and any design changes that fall within the spirit and the scope of the present disclosure are encompassed by the scope of the present disclosure.

What is claimed is:

1. A method for manufacturing a wiring board including an insulating substrate, and a wiring layer disposed on a surface of the insulating substrate and having a predetermined wiring pattern, the method comprising:

preparing the insulating substrate with seed-layer, the insulating substrate with seed-layer including: a conductive first underlayer on the surface of the insulating substrate; a conductive second underlayer on a surface of the conductive first underlayer; and a seed layer on a surface of the conductive second underlayer, the seed layer having a predetermined pattern corresponding to the wiring pattern and containing metal;

disposing a solid electrolyte membrane between an anode and the seed layer as a cathode, pressing the solid electrolyte membrane against at least the seed layer, and applying voltage between the anode and the conductive first underlayer to reduce metal ions contained in the solid electrolyte membrane and so form a metal layer on a surface of the seed layer; and removing an exposed portion of the conductive second underlayer without the seed layer from the insulating substrate, and after removal of the conductive second underlayer, removing an exposed portion of the conductive first underlayer without the seed layer from the insulating substrate to form the wiring layer, wherein the conductive first underlayer is formed of material having a higher electrical conductivity than that of the conductive second underlayer, and wherein the conductive second underlayer contains oxide in at least a surface of a portion of the conductive second underlayer, on which the seed layer is not formed, and the conductive first underlayer is formed of material having a higher electrical conductivity than that of a portion of the conductive second underlayer not containing the oxide.

2. The method for manufacturing the wiring board according to claim 1, wherein the conductive first underlayer has a volume resistivity within the range from $1.60 \times 10^{-8}$ Ω·m to $5.00 \times 10^{-7}$ Ω·m.

3. The method for manufacturing the wiring board according to claim 2, wherein the conductive second underlayer has a volume resistivity within the range from $1.0 \times 10^{-6}$ Ω·m to $3.7 \times 10^{-6}$ Ω·m.

4. The method for manufacturing the wiring board according to claim 1, wherein the conductive first underlayer has a 10-point average roughness Rz of 0.5 μm or less.

* * * * *